United States Patent
Chiba et al.

(10) Patent No.: US 7,823,276 B2
(45) Date of Patent: Nov. 2, 2010

(54) PARTS MOUNTING METHOD

(75) Inventors: Kazumoto Chiba, Iwate (JP); Seigo Sato, Iwate (JP)

(73) Assignee: Sony Corporation, Tokyo (JP)

( * ) Notice: Subject to any disclaimer, the term of this patent is extended or adjusted under 35 U.S.C. 154(b) by 609 days.

(21) Appl. No.: 11/099,453

(22) Filed: Apr. 6, 2005

(65) Prior Publication Data

US 2005/0243536 A1    Nov. 3, 2005

(30) Foreign Application Priority Data

Apr. 16, 2004    (JP)    ............... 2004-122179

(51) Int. Cl.
*H05K 3/30*    (2006.01)

(52) U.S. Cl. ............... 29/834; 29/466; 29/833; 29/840; 29/843; 228/180.22; 257/797; 382/151

(58) Field of Classification Search ........... 29/464–466, 29/740, 830–834, 840, 842, 843; 228/180.22; 257/797; 361/792, 808; 438/106; 382/149–151
See application file for complete search history.

(56) References Cited

U.S. PATENT DOCUMENTS

| | | | | |
|---|---|---|---|---|
| 5,768,107 A | * | 6/1998 | Ouchi et al. | ............... 361/792 |
| 6,044,549 A | * | 4/2000 | Kubin | ............... 29/840 |
| 6,326,239 B1 | * | 12/2001 | Asai et al. | ............... 438/106 |
| 6,757,966 B2 | * | 7/2004 | Inoue et al. | ............... 29/840 |
| 7,112,889 B1 | * | 9/2006 | Maruyama et al. | ............... 257/797 |

FOREIGN PATENT DOCUMENTS

| | | |
|---|---|---|
| JP | 63-100868 | 6/1988 |
| JP | 5-37197 | 2/1993 |
| JP | 6-177492 | 6/1994 |
| JP | 6-334281 | 12/1994 |
| JP | 7-22791 | 1/1995 |
| JP | 11-40908 | 2/1999 |
| JP | 2002-76694 | 3/2002 |
| JP | 2002-111148 | 4/2002 |
| JP | 2002-280681 | 9/2002 |

* cited by examiner

*Primary Examiner*—Donghai D. Nguyen
(74) *Attorney, Agent, or Firm*—Oblon, Spivak, McClelland, Maier & Neustadt, L.L.P.

(57) ABSTRACT

The present invention provides a printed circuit board that can suppress the positional displacement of parts mounted thereon. The printed circuit board includes resist formed on the surface of the printed circuit board, lands for receiving respective parts to be mounted, the lands being arranged off openings free from the resist, and lands for alignment, respectively alignment marks being formed on the land for alignment by means of solder.

7 Claims, 8 Drawing Sheets

PARTS MOUNTING METHOD

CROSS-REFERENCE TO RELATED APPLICATIONS

The present invention contains subject matter related to Japanese Patent Application JP 2004-122179 filed in the Japanese Patent Office on Apr. 16, 2004, the entire contents of which being incorporated herein by reference.

BACKGROUND OF THE INVENTION

1. Field of the Invention

This invention relates to a printed circuit board provided with alignment marks to be used for correcting, if necessary, the positions of the parts mounted on the substrate at the time of mounting them, a method of mounting parts on such a printed circuit board and a method of verifying each of the mounting positions of the parts mounted on such a printed circuit board.

2. Description of Related Art

It is a general practice that, when mounting parts such as semiconductor IC chips on the mounting surface of a printed circuit board, typically creamy solder is deposited on the mounting lands of the mounting surface of the printed circuit board by screen printing and, after mounting the parts on corresponding areas of the printed creamy solder, the entire printed circuit board is made to pass through a reflow furnace in order to heat and melt the solder and bond the parts to the corresponding lands by the solder.

When depositing creamy solder in the mounting process using the above described known method, the printing positions of creamy solder are corrected by referring to an alignment mark and also to substantially semicircular lands that have been arranged in advance on the mounting surface of the printed circuit board in order to minimize the positional errors of the printing positions of creamy solder so that solder may be deposited exactly at desired positions.

Additionally, when parts to be mounted are actually placed on the corresponding respective areas of the creamy solder that has been deposited by screen printing in the mounting process by means of the known method, the positions of the mounted parts are corrected by referring to the above described alignment mark in order to minimize the positional errors of the mounted parts.

With the above described method, a solder printing apparatus carries out the operation of correcting the areas of the creamy solder deposited by screen printing by referring to the alignment mark and a part mounting apparatus carries out the operation of correcting the positions of the mounted parts also by referring to the alignment mark. In other words, the two apparatus perform the respective position correcting operations separately by referring to a same single alignment mark that has been arranged in advance on the printed circuit board.

Therefore, if there arises an error of 180° in each of the position correcting operations that are equally performed by referring to the alignment marks, it may be impossible to mount the one or more than one part correctly on the respective areas of the creamy solder deposited by screen printing. Note that the above-cited position correcting method is described in Japanese Patent Application Laid-Open Publication No. 5-299794.

More specifically, referring to FIG. 1 of the accompanying drawings, if the position of the creamy solder 104 deposited on a mounting land 103 is corrected by referring to the alignment mark 102 arranged in advance on the mounting surface 101a of the printed circuit board 101 to consequently give rise to a positional error in the direction of arrow X in FIG. 1 to the creamy solder 104 deposited by screen printing and subsequently the position of the part 105 that is to be mounted on the creamy solder 104 deposited by screen printing by referring to the alignment mark is corrected to consequently give rise to a positional error in the direction opposite to the direction of X, it may be impossible to properly mount the part 105 on the creamy solder 104 that is deposited by screen printing.

In such a case, when the part 105 that is not aligned with the cream solder 104 is mounted on the printed circuit board 101 and the creamy solder 104 is heated and molten by means of a reflow soldering method, there will arise a problem of incorrect mounting position. The net result will be a low manufacturing yield.

SUMMARY OF THE INVENTION

In view of the above identified circumstances, it is desirable to provide a printed circuit board that can suppress the positional displacement, if any, of each part mounted on a printed circuit board relative to the corresponding solder area that can arise at the time of mounting the part, a method of mounting parts on such a printed circuit board and a method of verifying each of the mounting positions of the parts to be mounted on such a printed circuit board.

According to the present invention, the above object is achieved by providing a printed circuit board comprising: resist formed on the surface of the printed circuit board; lands for receiving respective parts to be mounted, the lands being arranged off openings free from the resist; and lands for alignment, respectively alignment marks being formed on the land for alignment by means of solder.

According to the present invention, there is provided a parts mounting method for mounting parts on respective lands for receiving parts to be mounted of a printed circuit board having resist formed on the surface thereof and lands for receiving respective parts to be mounted, the lands being arranged off openings free from the resist, a land for alignment being additionally formed on the printed circuit board, the method comprising: printing alignment marks on respective lands for alignment by means of solder at the time of printing lands for receiving parts to be mounted by means of solder; correcting with use of the alignment marks the mounting positions of the parts to be mounted on the respective solder areas formed on the lands for receiving parts; mounting the parts on the corrected respective mounting positions on the solder areas formed on the lands for receiving parts; and soldering the parts to the respective lands for receiving parts by heating and melting the solder.

According to the present invention, there is provided a mounting position verifying method for verifying the mounting positions of the parts to be mounted on a printed circuit board having resist formed on the surface thereof and lands for receiving respective parts to be mounted before actually mounting the parts on the printed circuit board, the lands being arranged off openings free from the resist, lands for alignment being additionally formed on the printed circuit board, respective spare marks being formed on the lands for alignment by means of resist independent from the surrounding resist, the method comprising: correcting the position for preliminarily anchoring each part to be mounted by referring to the spare marks.

Thus, according to the invention, when depositing solder on the lands for receiving respective parts by printing, which lands are arranged off openings that are free from the resist, alignment marks are collectively printed on the respective lands for alignment that are arranged on the printed circuit board by means of solder so that it is possible to correct the mounting positions of the parts to be mounted relative to the corresponding pieces of solder by referring to the alignment marks and hence suppress the positional displacements, if any, of the mounted parts relative to the corresponding pieces of solder during the operation of mounting the parts.

Therefore, according to the present invention, it is possible to suppress the problem of mounting parts to be mounted at incorrect positions on the printed circuit board and improve the manufacturing yield.

According to the present invention, it is possible to further suppress the positional displacements of the mounted parts because of the correction of the position for preliminarily anchoring each part to be mounted by referring to the spare marks before actually mounting the parts to be mounted on the printed circuit board.

DETAILED DESCRIPTION OF THE PREFERRED EMBODIMENTS

Now, the present invention will be described in greater detail by referring to the accompanying drawings that illustrate preferred embodiments of printed circuit board, method of mounting parts on a printed circuit board and method of verifying each of the mounting positions of the parts to be mounted on a printed circuit board according to the invention.

Figure 1:
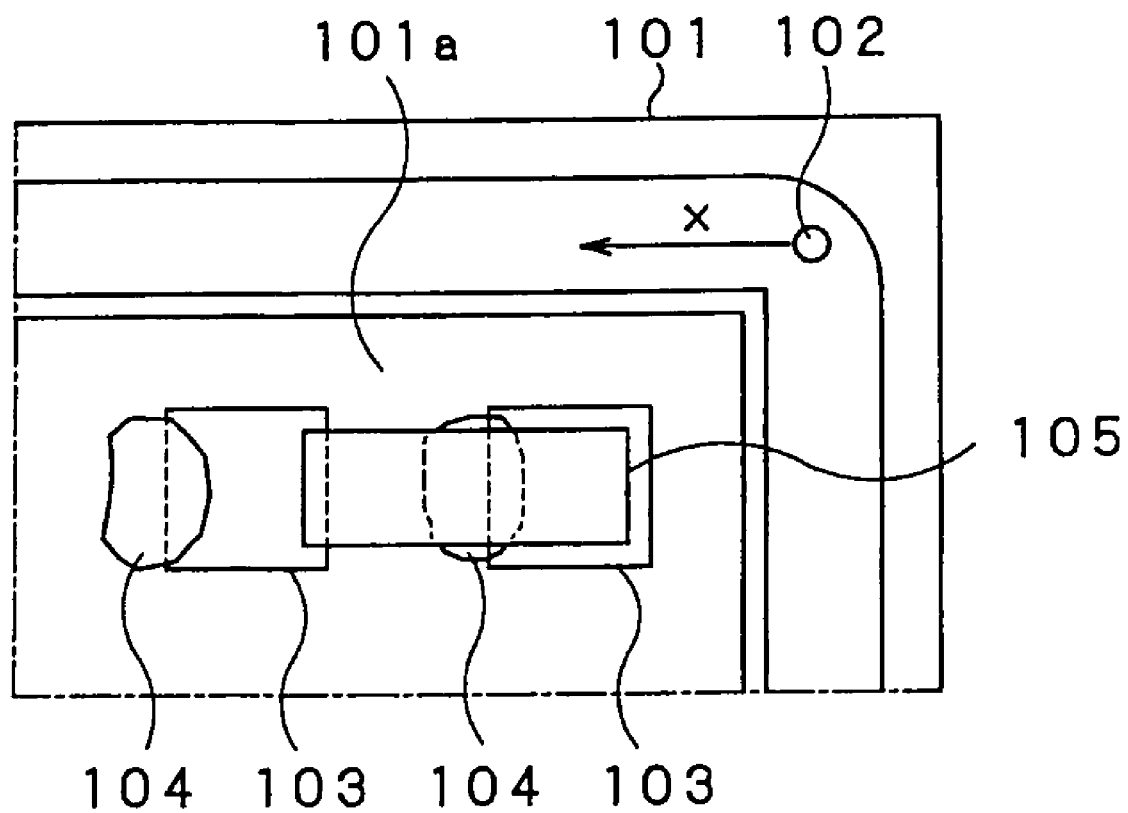
FIG. 1 is a schematic plan view of a known printed circuit board where the position where a part is mounted is displaced relative to the piece of solder.
Figure 2:
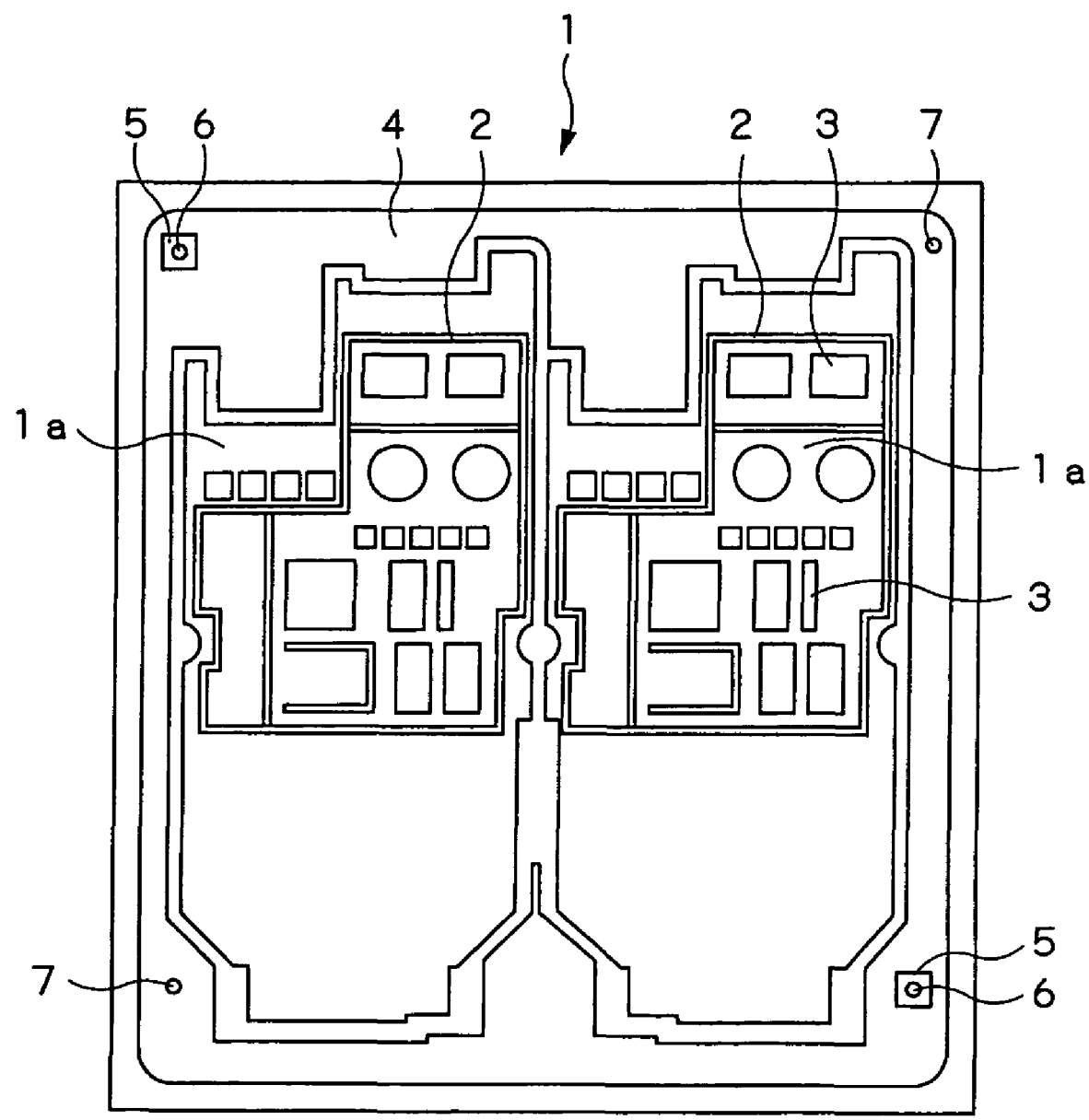
FIG. 2 is a schematic plan view of a printed circuit board to which the present invention is applied, showing the interior of the board.

FIG. 2 shows a printed circuit board 1, which is a multiple substrate formed by laying a plurality of electrically conductive layers one on the other with interposed insulating layers. The substrate comprises a plurality of circuit boards on which electric circuits of an electric appliance are arranged. Each of the circuit boards of the multiple substrates is punched out to show a predetermined profile and arranged in the cabinet of the electric appliance. Alignment marks are formed in the margin produced when the circuit boards are punched out from the multiple substrates. The alignment marks are intended to be used when depositing solder by printing and when correcting the position of the multiple substrates.

The printed circuit board 1 is provided with wiring patterns 2 that are typically made of copper foil and lands 3 for respectively receiving parts to be mounted.

Each wiring pattern 2 is a wiring layer prepared by patterning a metal layer of an electrically conductive metal such as copper to a predetermined pattern typically by means of photolithography.

When the printed circuit board 1 is a multilayer wiring substrate, the wiring patterns 2 formed on the respective layers are interconnected by way of conductors such as bias and/or through holes. Some of the wiring patterns 2 of the layers may be made to operate as functional layers including a grounding layer and one or more than one signal line layers.

The lands 3 for receiving parts are collectively formed at the time of forming the wiring patterns 2. They are regions where parts to be mounted are actually mounted typically by means of soldering.

The lands 3 for receiving parts are covered with a resist layer 4, which will be described in greater detail hereinafter, along with the uppermost wiring patterns 2 of the printed circuit board 1. The regions of the openings 4a produced by selectively removing the resist layer 4 are referred to as effective lands. The parts to be mounted are actually mounted on and soldered to the respective effective lands 3a.

As pointed out above, the printed circuit board 1 comprises a resist layer 4 that covers the wiring pattern 2 and the lands for receiving parts 3, which are formed on the uppermost layer. Openings 4a are formed through the resist layer 4 typically by selectively etching the resist layer 4 to expose the lands 3 for receiving parts that are arranged on the underlying layer.

Figure 3:
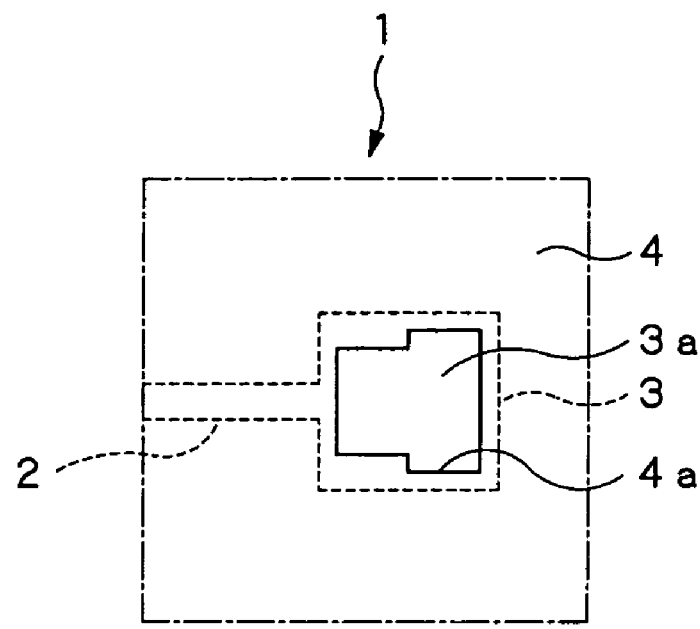
FIG. 3 is a schematic plan view of the printed circuit board of FIG. 1, showing a land for receiving parts to be mounted and the interior of the board.

The parts to be mounted are soldered to the respective lands 3 for receiving parts that are exposed through the corresponding respective openings 4a formed through the resist layer 4. In other words, the lands 3 for receiving parts that are exposed through the corresponding respective openings 4a are used to actually mount the parts to be mounted as shown in FIG. 3.

Figure 4:
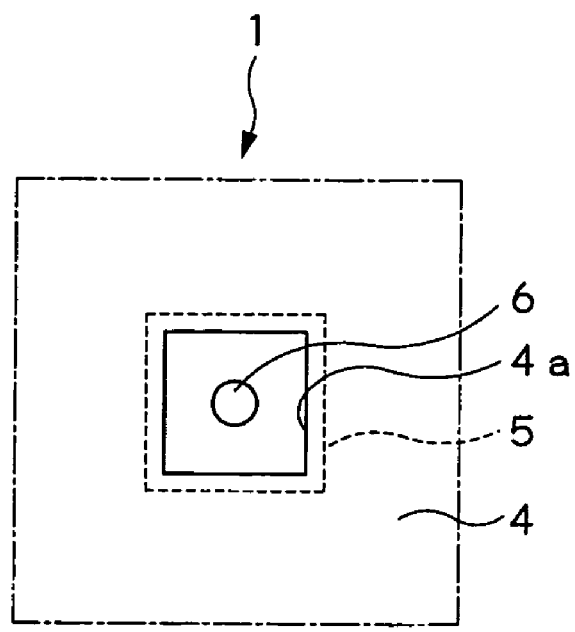
FIG. 4 is a schematic plan view of the printed circuit board of FIG. 1, showing a spare mark.

Now, referring to FIG. 4, a plurality of spare marks 6 of resist are formed on the lands for alignment that are exposed through the respective corresponding openings 4a formed at predetermined positions in the margin produced when the circuit boards are punched out from the multiple substrate, or the area other than the regions where parts to be mounted are actually mounted on the mounting surface 1a of the printed circuit board 1.

The spare marks 6 are collectively formed with the openings 4a at the time of forming the openings 4a through the resist layer 4 typically by means of an etching process. The spare marks 6 operate as so many alignment marks at the time of correcting and verifying the positions of the parts to be mounted. While the lands 5 for alignment are collectively formed at the time of forming the wiring patterns 2 just like the above-described lands 3 for mounting parts, they do not necessarily have to be connected to the wiring patterns 2. Rather, they operate as an under-layer that makes the spare marks 6 clearly noticeable when the latter are used as alignment marks.

Figure 5:
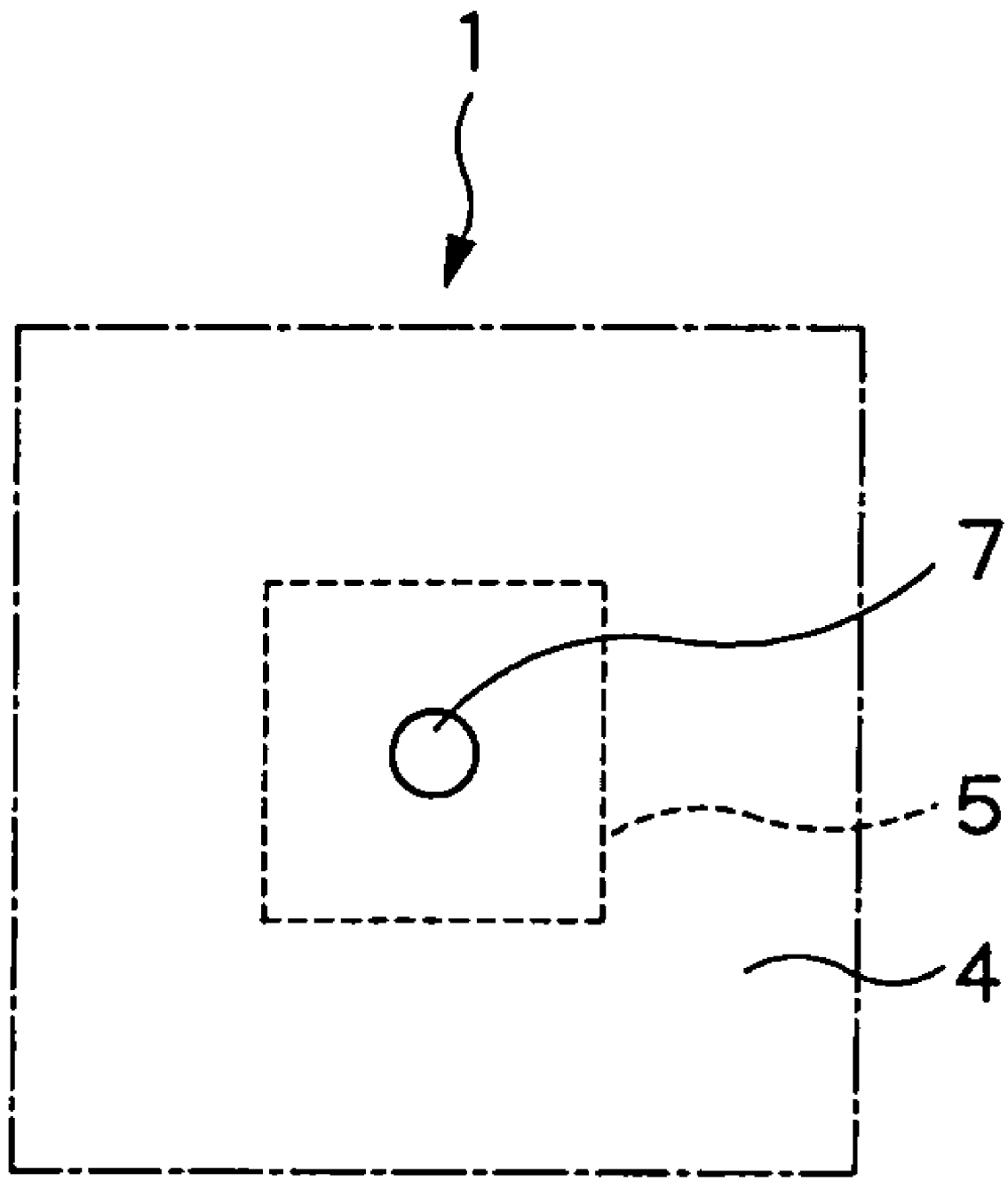
FIG. 5 is a schematic plan view of the printed circuit board of FIG. 1, showing a first alignment mark.

Referring to FIG. 5, a plurality of first alignment marks 7 are formed on the respective lands 5 for alignment for the purpose of correcting the positions of the pieces of solder 8 deposited by printing, which will be described in greater detail hereinafter, at respective predetermined positions in the margin that is produced when punching out the circuit boards from the multiple substrate of the printed circuit board 1.

The first alignment marks 7 have a substantially circular profile and are formed by removing the resist layer 4 on the lands 3 for receiving parts typically by means of an etching process. The lands 5 for alignment that become first alignment marks 7 do not necessarily have to be connected to the wiring patterns 2. Rather, they operate to make the first alignment marks 7 clearly noticeable by means of their metallic luster.

Figure 6:
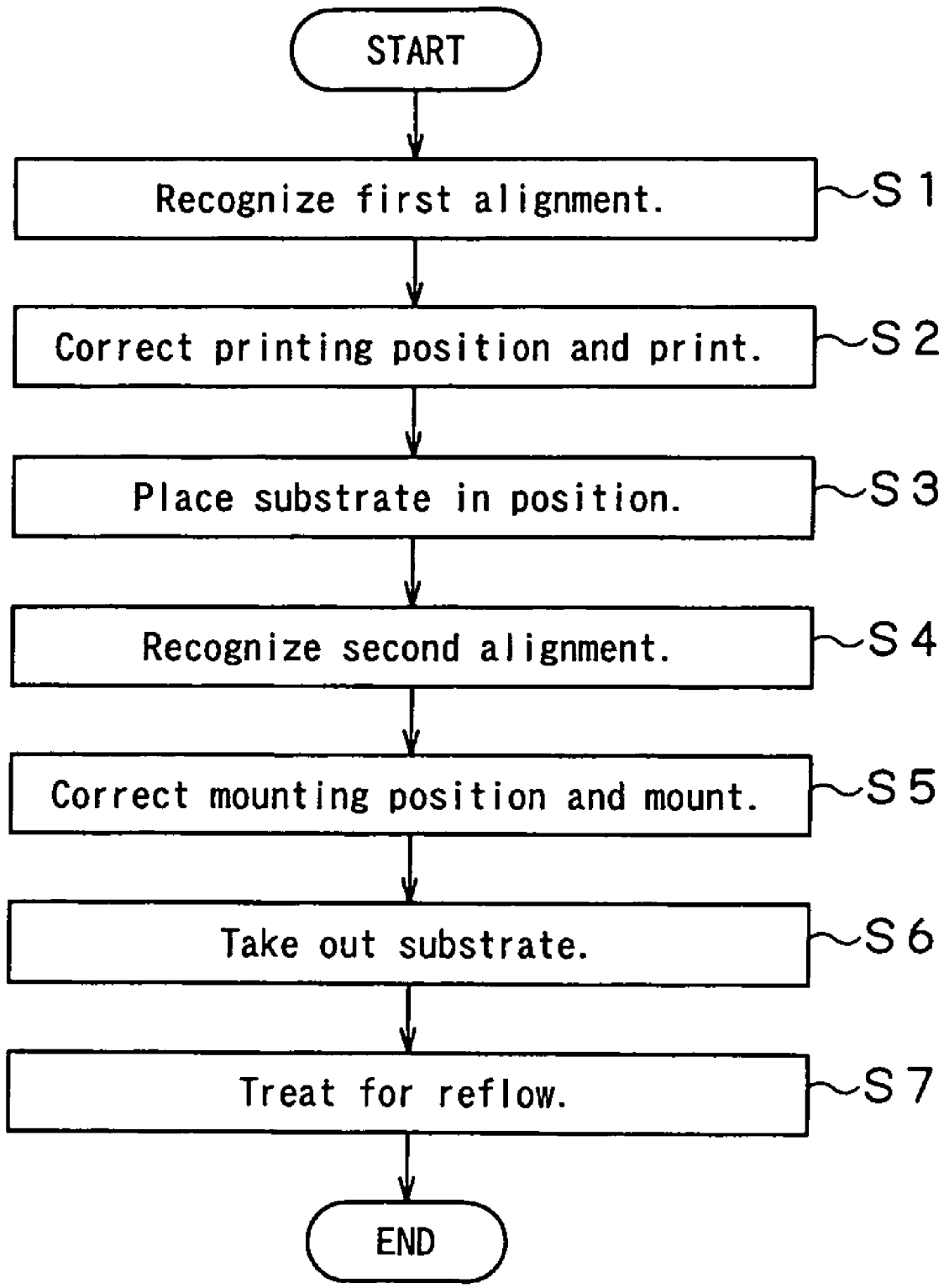
FIG. 6 is a flow chart, illustrating a parts mounting method according to the invention.

Now, the operation of actually mounting the parts to be mounted on the printed circuit board 1 will be described below by referring to the flow chart of FIG. 6.

Figure 7:
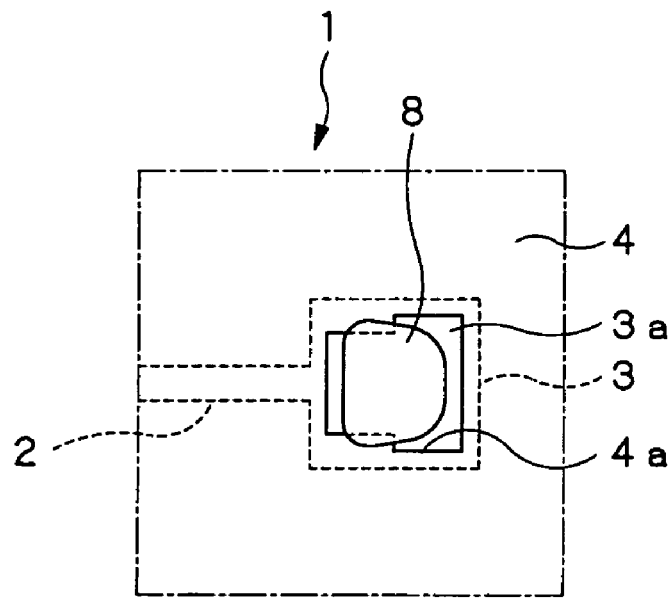
FIG. 7 is a schematic plan view of the printed circuit board of FIG. 1, showing a piece of solder deposed on the board by printing and the interior of the board.

When actually mounting the parts to be mounted on the printed circuit board 1, firstly pieces of solder 8, which is typically creamy solder, are deposited on the wiring pattern 2 and the effective lands 3a that are exposed through some of the openings 4a as shown in FIG. 7 by means of a solder printing apparatus (not shown).

Figure 8:
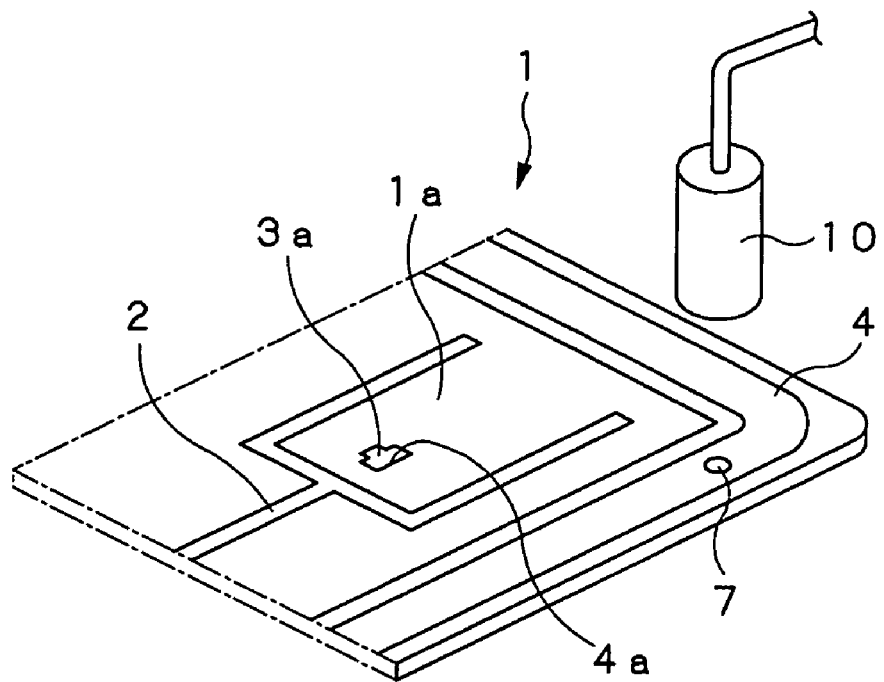
FIG. 8 is a schematic perspective view of the printed circuit board of FIG. 1, showing an image pickup element that is being operated to recognize a first alignment mark.

In Step S1, the solder printing apparatus for depositing solder by printing picks up an image of the first alignment marks 7 that are located along the edges of the printed circuit board 1 by means of an image pickup element 10 as shown in FIG. 8, which may typically be a CCD (charge coupled device) image sensor, and has its control section (not shown), which may typically be a CPU (central processing unit) arranged in the apparatus, recognize the positions of two or more than two of the first alignment marks 7 relative to the printed circuit board 1. At this time, the first alignment marks 7 that show a metallic luster and the dark areas of the resist layer 4 that surrounds the first alignment marks 7 are recognized properly due to difference of luminance between the bright pattern of the former and the dark pattern of the latter.

Then, in Step S2, the solder printing apparatus corrects the printing positions by means of the control section, using the information on the positions of the first alignment marks 7 taken in by the image pickup element 10 and the printing data stored in advance in the control section and deposits pieces of solder 8 on the exposed respective effective lands 3a on the mounting surface 1a of the printed circuit board 1 according to the corrected information on the printing positions.

Figure 9:
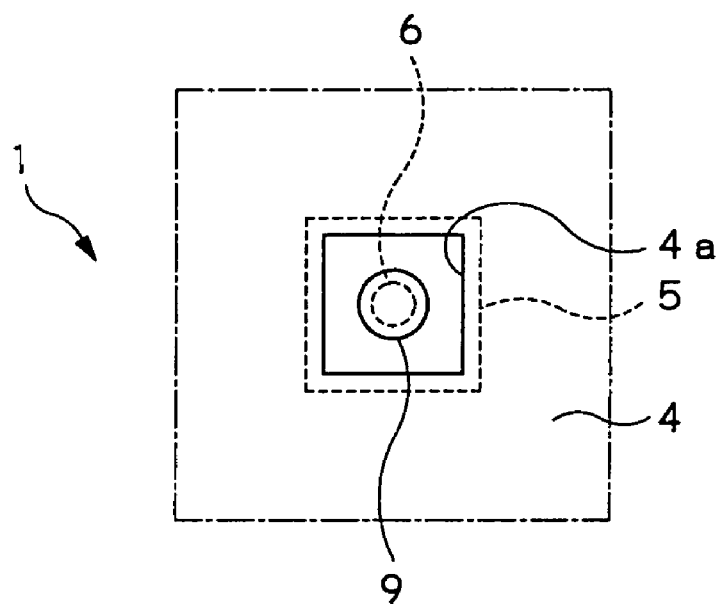
FIG. 9 is a schematic plan view of the printed circuit board of FIG. 1, showing a second alignment mark.

At this time, the solder printing apparatus also deposits pieces of solder as second alignment marks 9 by printing on the respective spare marks 6 so as to cover the spare marks 6 as shown in FIG. 9. The second alignment marks 9 have a substantially circular profile and operate as alignment marks to be used for correcting the mounting positions of the parts to be mounted in the step of mounting parts to be mounted, which will be described in greater detail hereinafter.

Then, in Step S3, a part mounting apparatus (not shown) places the printed circuit board 1 on which pieces of solder 8 are deposited by printing in Step S2 in position.

Figure 10:
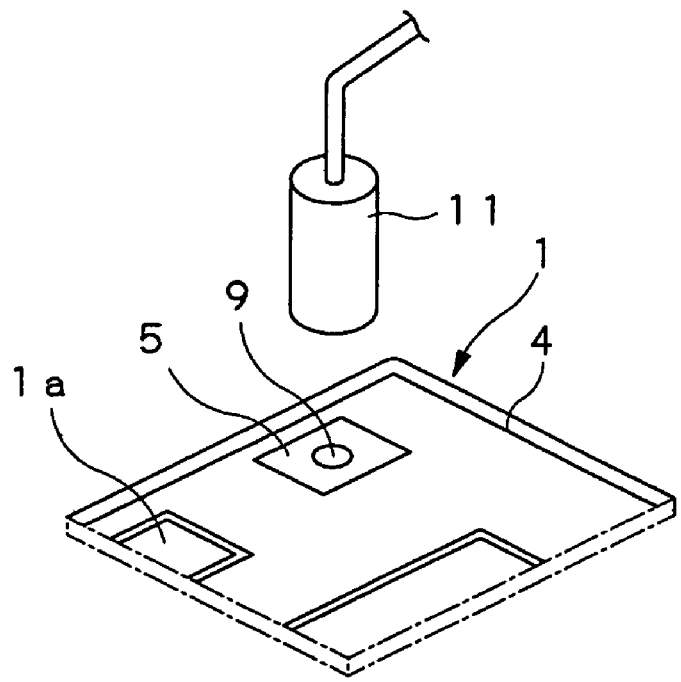
FIG. 10 is a schematic perspective view of the printed circuit board of FIG. 1, showing an image pickup element that is being operated to recognize a second alignment mark.

Then, in Step S4, the part mounting apparatus picks up an image of the second alignment marks 9 of creamy solder that are formed on the respective spare marks 6 by means of an image pickup element 11 as shown in FIG. 10 and has its control section contained in the apparatus recognize the positions of two or more than two of the second alignment marks 9 relative to the printed circuit board 1. At this time, the second alignment marks 9 that show a metallic luster and the dark lands 3 for receiving parts to be mounted that surround the respective second alignment marks 9 are recognized properly due to difference of luminance between the bright pattern of the former and the dark pattern of the latter.

Then, in Step S5, the part mounting apparatus corrects the mounting positions of the parts to be mounted by means of the control section, using the information on the positions of the second alignment marks 9 taken in by the image pickup element 11 and the mounting position data that is adjusted by means of a mounting position verifying method, which will be described in greater detail hereinafter, and actually mounts the parts to be mounted to the predetermined respective positions on the mounting surface 1a of the printed circuit board 1 according to the corrected mounting position data. If an operation of verifying the mounting position is not conducted, the mounting positions are corrected according to the information on the positions of the second alignment marks 9 and the mounting position data stored in the control section in advance.

Since the part mounting apparatus can correct the mounting positions of the parts to be mounted relative to the pieces of solder 8 by referring to the second alignment marks 9 that are made of solder so that it is possible to suppress the positional displacement, if any, of each part to be mounted relative to the pieces of solder 8.

Then, the printed circuit board 1 on which the parts are mounted at the predetermined respective positions is taken out from the part mounting apparatus in Step S6.

Subsequently, in Step S7, the printed circuit board 1, on which now the parts are mounted, is subjected to a solder reflow process, in which the printed circuit board 1 is forced to pass through a reflow furnace. More specifically, the pieces of solder 8 are heated and molten in the reflow furnace. Subsequently, the molten pieces of solder 8 are cured and the parts to be mounted are soldered to the wiring patterns 2 and the effective lands 3a that are exposed on the mounting surface 1. Thus, the parts to be mounted are actually mounted on the mounting surface 1a of the printed circuit board 1.

With the above-described mounting method, the second alignment marks 9 are formed by depositing solder when pieces of solder 8 are deposited on the mounting surface 1a of the printed circuit board 1 by printing and subsequently the mounting positions of the parts to be mounted are corrected relative to the pieces of solder 8 by referring to the second alignment marks 9. Thus, it is possible to suppress the positional displacement, if any, of each part to be mounted relative to the pieces of solder 8.

Therefore, with the above-described method, it is possible to suppress the problem of mounting parts to be mounted at incorrect positions on the printed circuit board 1 and improve the manufacturing yield.

While the second alignment marks 9 are deposited on the corresponding respective spare marks 6 by printing according to the above described method, it is not necessary to use spare marks 6 and the second alignment marks 9 may be deposited directly on the corresponding respective lands 5 for alignment by printing if the step of verifying the positions for receiving parts to be mounted is omitted as will be discussed hereinafter.

The positional displacement, if any, of each part to be mounted can be suppressed further by verifying the positions where parts are to be mounted on the printed circuit board 1 before actually mounting the parts to be mounted on the printed circuit board 1. In other words, the following processing steps are carried out as preparatory steps before producing a mounted substrate.

In the past, the alignment marks that are used for correcting the positions of the pieces of solder deposited by printing are also used for correcting the positions where respective parts are mounted for the purpose of verifying the positions where the parts are to be mounted before actually mounting the parts on a printed circuit board. Therefore, the printed circuit board, which carries double-face tapes applied to the mounting surface thereof where solder has not been deposited by printing yet, is driven to pass through a part mounting apparatus so as to temporarily mount parts to be mounted on the respective double-face tapes for the purpose of regulating the positions of the mounted parts.

However, with a parts mounting method according to the invention, since the second alignment marks 9 of creamy solder are used for correcting the positions of the mounted parts, it is not feasible to apply double-face tapes to the mounting surface 1a of the printed circuit board 1 where pieces of solder 8 are deposited by printing. Therefore, the positions where parts are mounted are regulated by means of a mounting position verifying method as will be described hereinafter.

Figure 11:
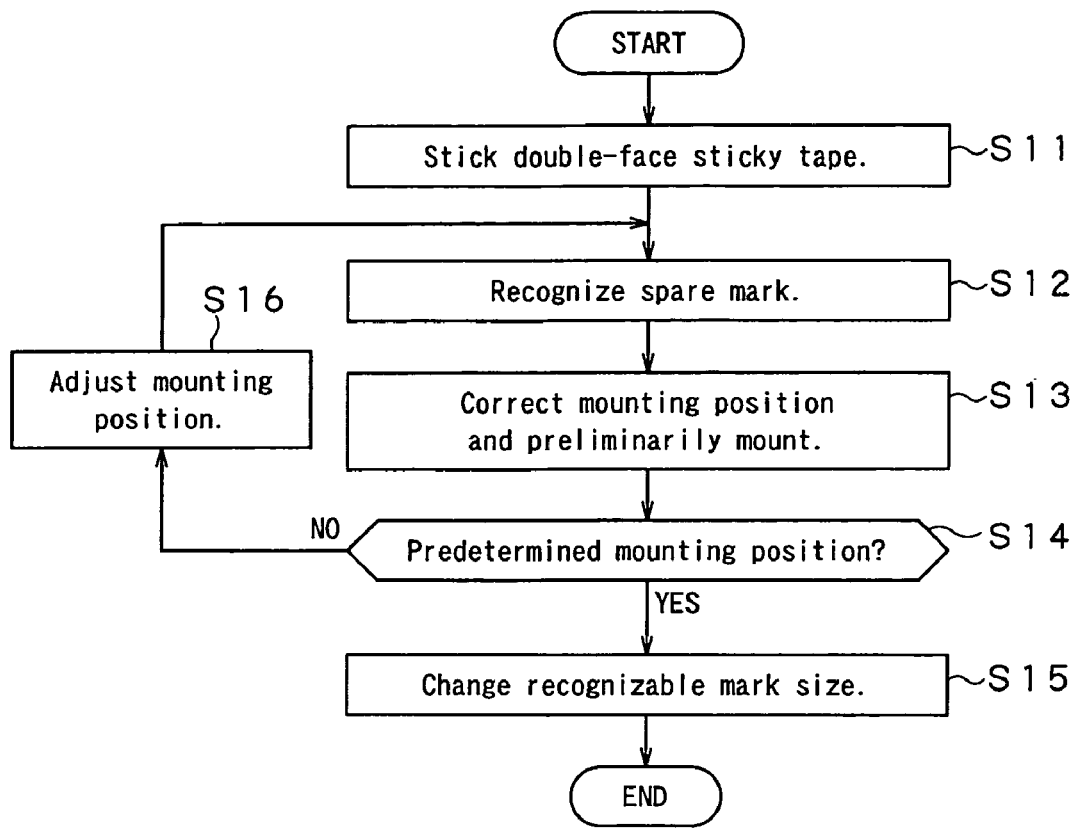
FIG. 11 is a flow chart, illustrating a mounting position verifying method according to the invention.

Now, the mounting position verifying method for verifying the positions where the parts are to be mounted on a printed circuit board 1 according to the invention will be described below by referring to the flow chart of FIG. 11.

When verifying the positions where the respective parts are to be mounted on a printed circuit board 1, firstly, double-face tapes are applied to the positions where respective parts are to be mounted on the mounting surface 1a of the printed circuit board 1 on which no pieces of solder are deposited by printing in Step S11 and the printed circuit board 1 is put into a part mounting apparatus.

Figure 12:
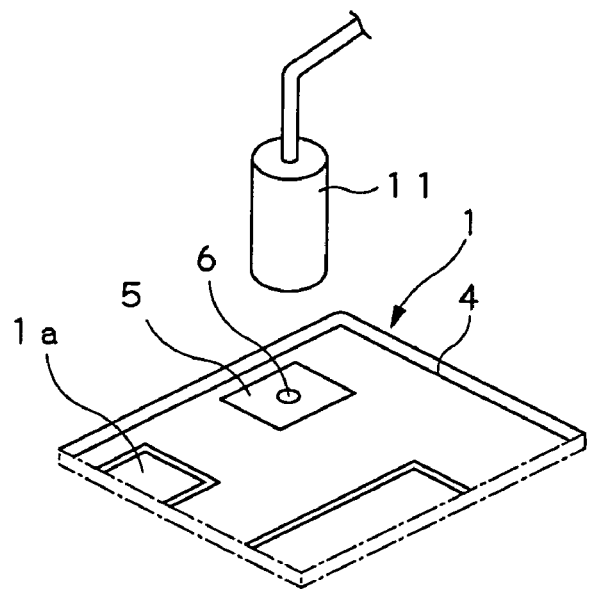
FIG. 12 is a schematic perspective view of the printed circuit board of FIG. 1, showing an image pickup element that is being operated to recognize a spare mark.

Then, in Step S12, the part mounting apparatus has the image pickup element 11 of the CCD image sensor or the like it comprises pick up an image of the spare marks 6 arranged along the edges of the printed circuit board 1 as shown in FIG. 12 and has its control section recognize the positions of two or more than two of the spare marks 6 relative to the printed circuit board 1. At this time, the spare marks 6 that show a metallic luster and the dark lands 3 for receiving parts to be mounted that surround the respective spare marks 6 are recognized properly due to difference of luminance between the bright pattern of the former and the dark pattern of the latter.

Thereafter, in Step S13, the part mounting apparatus corrects the positions where parts are to be mounted by means of the control section, using the information on the positions of the spare marks 6 taken in by the image pickup element 11 and the data on the positions for receiving the respective parts as stored in advance in the control section and actually mounts the parts to be mounted on the respective double-face tapes arranged on the mounting surface 1a of the printed circuit board 1 according to the information on the corrected positions for receiving the respective parts. As a result, the mounted parts are preliminarily anchored to the mounting surface 1a of the printed circuit board 1 by means of the respective double-face tapes. Thus, the parts are preliminarily mounted on the printed circuit board 1.

Then, in Step S14, it is visually determined if the parts are mounted properly to the predetermined respective positions on the printed circuit board 1.

If it is determined in Step S14 that the parts are mounted properly to the predetermined respective positions on the mounting surface 1a of the printed circuit board 1, the part mounting apparatus proceeds to Step S15. If, on the other hand, it is determined in Step S14 that the parts are not mounted properly to the predetermined respective positions on the mounting surface 1a of the printed circuit board 1, the part mounting apparatus proceeds to Step S16, where it regulates the positions to which the parts are mounted on the mounting surface 1a of the printed circuit board 1 by referring to the state of the preliminarily anchored parts. After the regulating operation, all the preliminarily mounted parts are dismounted and the steps from Step S12 on are repeated.

Then, if it is determined in Step S14 that the parts are mounted properly to the predetermined respective positions on the mounting surface 1a of the printed circuit board 1, the part mounting apparatus proceeds to Step S15, where it changes the size of alignment mark that its image pickup element 11 recognizes from the size of the spare marks 6 to that of the second alignment marks 9 so that the image pickup element 11 can recognize the second alignment marks 9. As a result, the part mounting apparatus can mount the parts to be mounted onto the printed circuit board 1 where pieces of solder 8 are deposited by printing with minimized positional displacements.

It may be appreciated that it is necessary to carry out the operation of verifying the positions for receiving respective parts only once before actually mounting the parts onto the printed circuit board so long as the selected type of printed circuit board 1 is switched to some other type.

It should be understood by those skilled in the art that various modifications, combinations, sub-combinations and alterations may occur depending on design requirements and other factors insofar as they are within the scope of the appended claims or the equivalents thereof.

What is claimed is:

1. A parts mounting method for mounting parts on a printed circuit board having lands for receiving parts to be mounted on the printed circuit board having resist formed on the surface thereof, the lands for receiving parts having exposed openings free from the resist, the printed circuit board also including lands for alignment having exposed openings free from the resist, the lands for receiving parts and the lands for alignment made of electrically conducting metal, the method comprising:

locating said lands for receiving parts and said lands for alignment at separate locations on said printed circuit board by detecting the metal of the lands for receiving parts and the metal of the lands for alignment;

depositing solder on the lands for receiving parts to form a pieces of solder for attaching the parts to be mounted, and depositing solder on the metal of the lands for alignment to form solder alignment marks;

correcting with use of positions of the solder alignment marks mounting positions of the parts to be mounted on the pieces of solder formed on the lands for receiving parts;

mounting the parts on the corrected mounting positions on the pieces of solder formed on the lands for receiving parts and soldering the parts to the lands for receiving parts by heating and melting the solder; and forming spare marks of solder resist onto the lands for alignment before said depositing solder on the metal of the lands for alignment, wherein in said deposition solder on the lands for alignment, the spare marks are entirely covered by the solder alignment marks.

2. The method according to claim 1, wherein said step of correcting further comprises:

recognizing the lands for alignment as bright patterns and the solder alignment marks as dark patterns.

3. The method according to claim 1, further comprising the steps of:

forming apertures through the resist on the lands for alignment on the printed circuit board to form spare marks; and preliminarily anchoring the part to be mounted by referencing a position of the part to be mounted to the spare marks.

4. The method according to claim 1, wherein the lands for alignment are distinct from the lands for receiving parts, and the lands for alignment are not used to attach the parts to be mounted.

5. The method according to claim 1, wherein said depositing solder on the lands for receiving parts and said depositing solder on the lands for alignment are performing during a same solder deposition step.

6. The method according to claim 1, further comprising:
using first alignment marks, separate from the lands for alignment, to control a location of solder deposition during said step of depositing solder on the lands for receiving parts and on the lands for alignment.

7. The method according to claim 1, wherein said step of locating is done by the use of an image pickup apparatus.

* * * * *